(12) United States Patent
RamachandraRao et al.

(10) Patent No.: US 7,038,324 B2
(45) Date of Patent: May 2, 2006

(54) WAFER STACKING USING INTERCONNECT STRUCTURES OF SUBSTANTIALLY UNIFORM HEIGHT

(75) Inventors: Vijayakumar S. RamachandraRao, Hillsboro, OR (US); Shriram Ramanathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/814,498

(22) Filed: Mar. 31, 2004

(65) Prior Publication Data

US 2005/0221581 A1    Oct. 6, 2005

(51) Int. Cl.
*H01L 21/44*    (2006.01)
*H01L 29/40*    (2006.01)

(52) U.S. Cl. .................. 257/782; 257/621; 438/109

(58) Field of Classification Search ........ 438/106–109, 438/455, 456, 625, 629, 642, 652, 672, 675; 257/621–623, 736, 748, 750–752, 781–786
See application file for complete search history.

(56) References Cited

U.S. PATENT DOCUMENTS

| | | | |
|---|---|---|---|
| 6,106,735 A | 8/2000 | Kurle et al. | |
| 6,558,109 B1 | 5/2003 | Gibbel | |
| 6,627,985 B1 | 9/2003 | Huppenthal et al. | |
| 2004/0262772 A1* | 12/2004 | Ramanathan et al. | 257/777 |
| 2005/0003650 A1* | 1/2005 | Ramanathan et al. | 438/614 |

* cited by examiner

*Primary Examiner*—David Nelms
*Assistant Examiner*—Calvin Lee
(74) *Attorney, Agent, or Firm*—Schwabe, Williamson & Wyatt, P.C.

(57) ABSTRACT

Wafer stacking employing substantially uniform copper structures is described herein.

14 Claims, 3 Drawing Sheets

WAFER STACKING USING INTERCONNECT STRUCTURES OF SUBSTANTIALLY UNIFORM HEIGHT

TECHNICAL FIELD & BACKGROUND

The present invention generally relates to the field of integrated circuits. More specifically, the present invention relates to wafer stacking for 3-dimensional integration.

Recently, there is increasing interest in the semiconductor industry to stack wafers, i.e. joining two or more wafers together, one on top (or underneath) the other. One of the more practical ways of bonding two wafers is by fusing copper structures on 2 wafers at high temperatures & external pressure. One area of difficulty preventing the accomplishment of quality stacking is the non-uniformity of the heights of copper structures relative to the dielectric (e.g. oxide), when copper structures are to be used to join the wafers together, and conventional chemical mechanical polishing (CMP) process is to be employed to create the copper structures.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a component having wafers stacked using copper structures of substantially uniform heights, method for making such component, and system having such component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
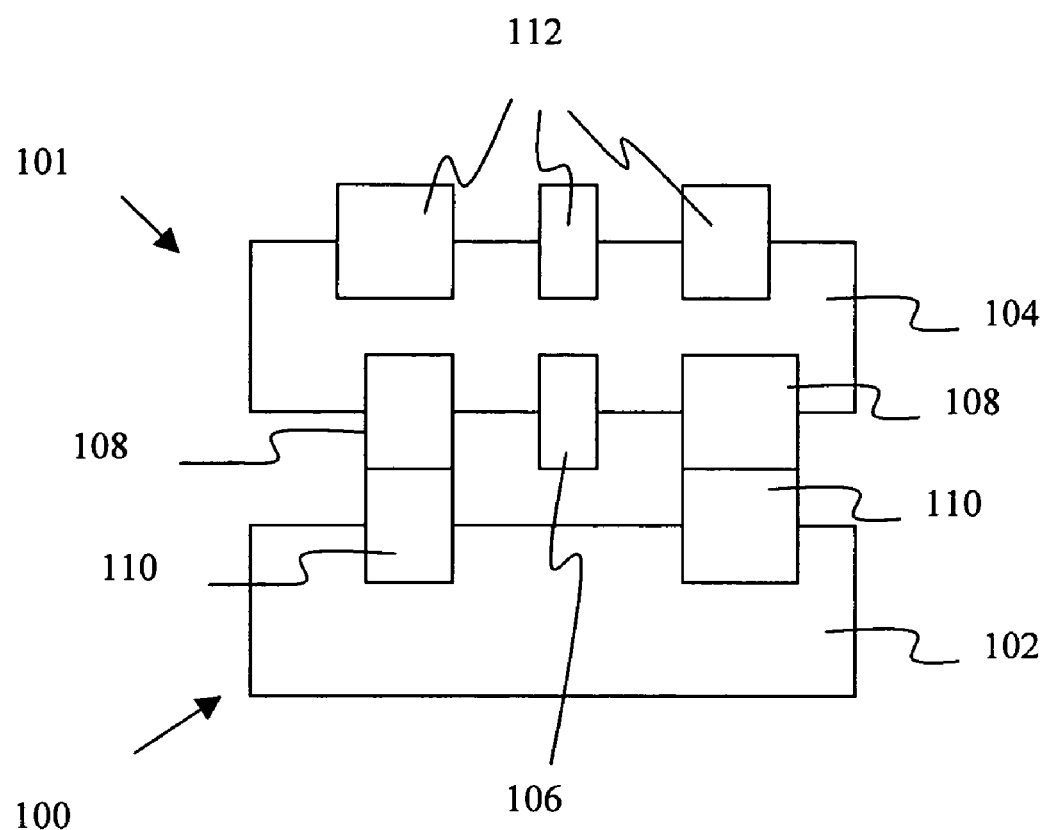
FIG. 1 illustrates a cross sectional view of two stacked wafers, in accordance with one embodiment.

Referring now to FIG. 1, wherein a first wafer 100 is illustrated as having copper structures 110 embedded therein, and rise above the interlayer dielectic layer 102 with a substantially uniform height. Illustrated also are copper structures 106, 108 embedded, and rise above the interlayer dielectric layer 104 of a second wafer 101 with a substantially uniform height. In one embodiment, the uniformity of heights of any or all the copper structures 106, 108, 110 and 112 on the wafers 100 and 101 can be expressed as a difference of no more than 5 nm between the height of one copper structure to another copper structure. In another embodiment, the height of the copper structures 106, 108, 110 above the plane of the interlayer dielectric layers 102, 104 can be in a range of 100–300 nm.

With regard to FIG. 1, the copper structures 108 are then aligned and bonded to the copper structures 110 so that they make interconnections between the wafers 100 and 101. The copper structure 106 is part of a copper interconnect on the wafer 101 that does not need or require any connection to circuits that maybe interconnected by copper structures 110 on wafer 100.

When wafer 101 is placed on top of the wafer 100 shown, copper structure 106 is positioned and aligned in an area above the interlayer dielectric layer 102 of wafer 100. Thus, copper structure 108 is insulated by air or the interlayer dielectric layer 102 from the copper structures 110. And copper structures 106 of wafer 101 align together and are bonded with copper structures 110 on the wafer 100. Thus, they make connections between circuits on wafers 100 and 101.

Figure 2A:
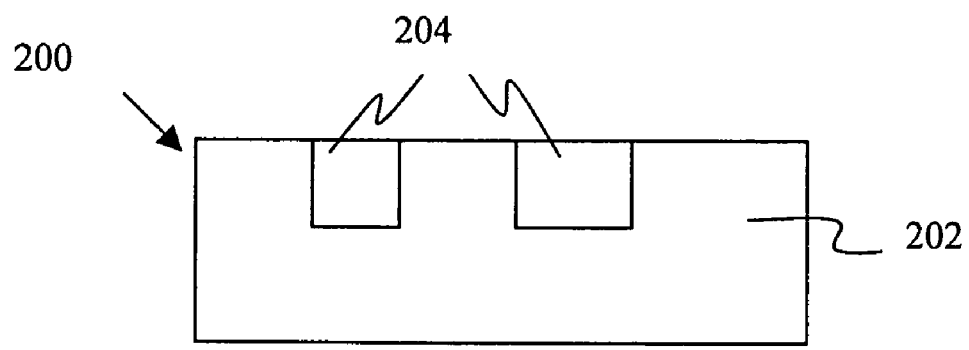
FIGS. 2a–2c illustrate a method for making wafer of FIG. 1, in accordance with one embodiment.
Figure 2B:
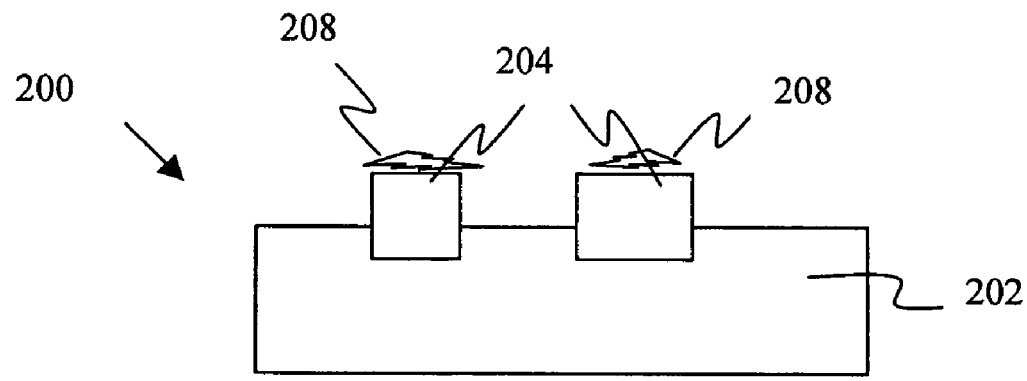
Figure 2C:
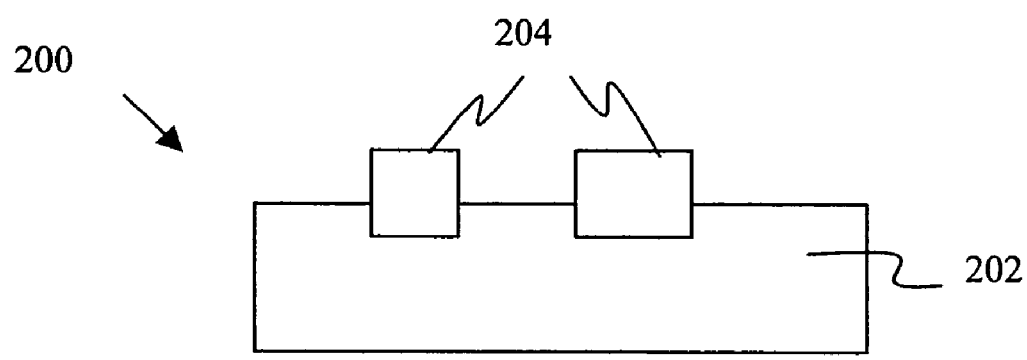

FIGS. 2a–2c, illustrate a method of making a wafer 200 that has copper structures 204 embedded in the interlayer dielectric layer 202 and created with substantially uniform height above the dielectric layer 202. The method uses a variety of wet etch chemistries to remove the interlayer dielectric layer 202 leaving the copper structures to stand above the removed interlayer dielectric layer 202 as shown in FIG. 2b.

First, etchant is applied to the wafer 200 of FIG. 2a to remove a portion of the interlayer dielectric layer 202. As shown, wafer 200 includes copper structures 204 embedded in the interlayer dielectric layer 202. In one embodiment, a diluted hydrofluoric acid is used to remove part of the interlayer dielectric layer 202. In another embodiment, a diluted organic hydrofluoric acid, assisted by a super critical $CO_2$ is used to remove part of the interlayer dielectric layer 202. In a further embodiment, an ethylene glycol based solution and a fluorine ion source is used to remove part of the interlayer dielectric layer 202. In another embodiment, a buffered oxide etch reactant is used to remove parts of the interlayer dielectric layer 202.

In another embodiment, a buffered oxide etch reactant, an ethylene glycol based solution and a diluted hydrofluoric acid are used to remove part of the interlayer dielectric layer 202. The heights of the copper structures 204 or the recess depth of the interlayer dielectric 202 can be controlled by simply varying the etch time or in the case of hydrofluoric acid, by changing the concentration of the acid. After etching the wafer 200 can be rinsed with deionized water. Etching of the wafer 200 by a diluted organic hydrofluoric acid, assisted by a super critical $CO_2$ to remove part of the interlayer dielectric layer 202, does not require a water rinse.

In alternate embodiments, a corrosion inhibitor, such as benzotriazole (BTAH), or other reagents with organic head groups can be selectively adsorbed onto Cu using electroless deposition techniques to protect Cu from the aqueous media during the etch operation. For example, PEO may be coated selectively onto copper prior to the etching operation. The coating will serve to protect the copper surface from being attacked during the oxide-etching operation. Further, the oxide recess depth can be controlled by simply varying the etch time or in case of using HF, by changing the concentration of the HF or by the flow of the chemistry (contact-time of the chemical).

FIG. 2b shows that residues or oxides of copper 208 may still be left on the surface of the copper structures 204 after etching. A reactive pre-cleans plasma, for example hydrogen-based, can be used to remove the residues 208 on the surface of the copper structures 204. FIG. 2c shows the resulting clean surface of copper structure 204 after removal of the residues 208.

After creating two wafers in the manner discussed above with regard to FIGS. 2a–2c, the two wafers can be aligned and bonded using any one of a number of bonding and alignment tools. The side view of FIG. 2c shows the copper structures 204 rising vertically to a substantially uniform height above the plane of the interlayer dielectric layer 202.

Figure 3:
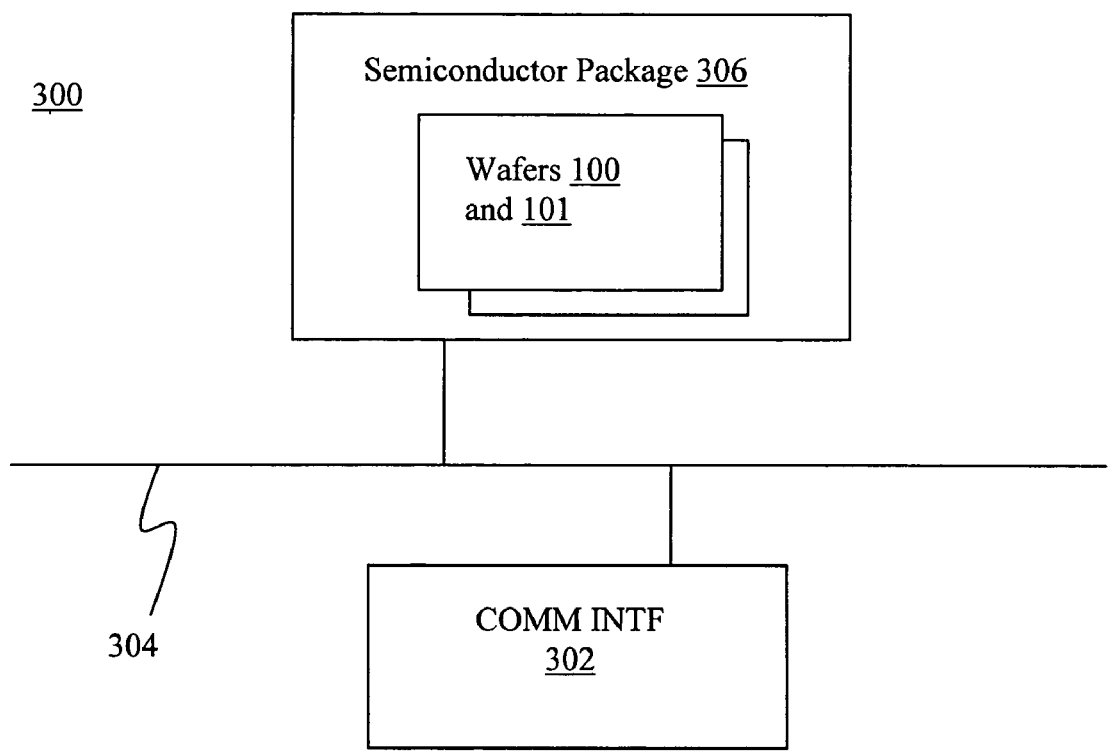
FIG. 3 illustrates a system having a component with the stacked wafers of FIG. 1 in accordance with one embodiment.

FIG. 3 illustrates a system in accordance with one embodiment. As illustrated, for the embodiment, system 300 includes a communication interface component 302 coupled to a bus 304. The bus 304 is coupled to the semiconductor package 306 and the semiconductor package 306 comprises wafers 100 and 101. In various embodiments, wafers 100 and 101 may comprise a number of microprocessors, a microprocessor and a graphics co-processor, a microprocessor and a controller, or a memory controller and a bus controller. In various embodiments, system 300 may be a palm sized computer, a tablet computer, a laptop computer, a desktop computer, a server, a digital camera, a digital versatile disk player or a set-top box. Communication interface component 302 may be a network interface component, wireline based or wireless.

Thus, it can be seen from the above descriptions, a novel component having formations of copper interconnecting stacked wafers, method for making such a component, and a system having such a component have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. An apparatus comprising:
a first wafer having a first interlayer dielectric layer and a first plurality of copper structures of first substantially uniform heights with each difference between any two of the first substantially uniform heights being 5 nm or less, disposed on the first interlayer dielectric layer; and
a second wafer having a second interlayer dielectric layer and a second plurality of copper structures of second substantially uniform heights with each difference between any two of the second substantially uniform heights being 5 nm or less, disposed on the second interlayer dielectric layer, the second wafer being stacked on the first wafer, with at least some of the first and second plurality of copper structures being substantially aligned and bonded to each other.

2. The apparatus of claim 1, wherein at least a selected one of the first and second substantially uniform heights is in a range of 100–300 nm.

3. The apparatus of claim 2, wherein both the first and second substantially uniform heights are in the range of 100–300 nm.

4. A system comprising:
a semiconductor package having
a first die having a first interlayer dielectric layer and a first plurality of copper structures of first substantially uniform heights disposed on the first interlayer dielectric layer, where each difference between any two of the first substantially uniform heights is 5 nm or less; and
a second die having a second interlayer dielectric layer and a second plurality of copper structures of second substantially uniform heights disposed on the second interlayer dielectric layer, where each difference between any two of the second substantially uniform heights is 5 nm or less, the second die being stacked on the first die, with at least some of the first and second plurality of copper structures being substantially aligned and bonded to each other;
a bus coupled to the semiconductor package; and
a networking interface component coupled to the bus.

5. The system of claim 4, wherein at least a selected one of the first and second substantially uniform heights of the semiconductor package is in a range of 100–300 nm.

6. The system of claim 5, wherein both of the first and second substantially uniform heights of the semiconductor package is in the range of 100–300 nm.

7. The system of claim 4, wherein the system is a selected one of a digital versatile disk player and a set-top box.

8. An apparatus comprising:
a first wafer having a first interlayer dielectric layer and a first plurality of electrically conductive structures of first substantially uniform heights with each difference between any two of the first substantially uniform heights being in a range of 1 nm to 5 nm, disposed on the first interlayer dielectric layer; and
a second wafer having a second interlayer dielectric layer and a second plurality of electrically conductive structures of second substantially uniform heights with each difference between any two of the first substantially uniform heights being in a range of 1 nm to 5 nm, disposed on the second interlayer dielectric layer, the second wafer being stacked on the first wafer, with at least some of the first and second plurality of electrically conductive structures being substantially aligned and bonded to each other.

9. The apparatus of claim 8, wherein at least a selected one of the first and second substantially uniform heights is in a range of 100 nm to 300 nm.

10. The apparatus of claim 8, wherein both the first and second substantially uniform heights are in the range of 100 nm to 300 nm.

11. A system comprising:
a semiconductor package having
a first die having a first interlayer dielectric layer and a first plurality of electrically conductive structures of first substantially uniform heights with each difference between any two of the first substantially uniform heights being in a range of 1 nm to 5 nm; and a second die having a second interlayer dielectric layer and a second plurality of electrically conductive structures of second substantially uniform heights with each difference between any two of the second substantially uniform heights being in a range of 1 nm to 5 nm, the second die being stacked on the first die, with at least some of the first and second plurality of copper structures being substantially aligned and bonded to each other;

a bus coupled to the semiconductor package; and a networking interface component coupled to the bus.

12. The system of claim 11, wherein at least a selected one of the first and second substantially uniform heights of the semiconductor package is in a range of 100 nm to 300 nm.

13. The system of claim 12, wherein both of the first and second substantially uniform heights of the semiconductor package is in the range of 100 nm to 300 nm.

14. The system of claim 11, wherein the system is a selected one of a digital versatile disk player and a set-top box.

* * * * *